United States Patent [19]

Yamamoto et al.

[11] Patent Number: 4,811,350

[45] Date of Patent: Mar. 7, 1989

[54] SEMICONDUCTOR LASER APPARATUS

[75] Inventors: Osamu Yamamoto, Nara; Shigeki Maei, Yamatokoriyama; Hiroshi Hayashi, Kyoto; Hidenori Kawanishi, Higashiosaka; Nobuyuki Miyauchi, Tenri, all of Japan

[73] Assignee: Sharp Kabushiki Kaisha, Osaka, Japan

[21] Appl. No.: 81,503

[22] Filed: Aug. 4, 1987

[30] Foreign Application Priority Data

Aug. 5, 1986 [JP] Japan .................. 61-184905

[51] Int. Cl.⁴ ............................................. H01S 3/13
[52] U.S. Cl. ........................................ 372/43; 372/36; 372/92; 357/74
[58] Field of Search ............... 357/19, 74; 372/43, 372/92, 96, 36, 50, 32

[56] References Cited

U.S. PATENT DOCUMENTS

| 3,573,654 | 4/1971 | Smiley | 331/94.5 |
|---|---|---|---|
| 4,270,134 | 5/1981 | Takeda et al. | 357/19 |
| 4,338,577 | 7/1982 | Sato et al. | 357/19 |
| 4,351,051 | 9/1982 | Van Alem et al. | 357/19 |
| 4,355,321 | 10/1982 | Yeats | 357/19 |
| 4,366,492 | 12/1982 | Kitamura | 357/74 |
| 4,567,598 | 1/1986 | Noguchi et al. | 357/74 |

FOREIGN PATENT DOCUMENTS

| 0111387 | 7/1983 | Japan | 372/43 |
|---|---|---|---|
| 0143594 | 8/1983 | Japan | 372/92 |
| 0078589 | 5/1984 | Japan | 372/108 |
| 0117279 | 7/1984 | Japan | 357/19 |
| 0076709 | 5/1985 | Japan | 357/19 |
| 0001077 | 1/1986 | Japan | 372/33 |
| 0168985 | 7/1986 | Japan | 372/50 |
| 0174688 | 8/1986 | Japan | 372/43 |

Primary Examiner—William L. Sikes
Assistant Examiner—Xuan Thi Vo
Attorney, Agent, or Firm—Ciotti & Murashige, Irell & Manella

[57] ABSTRACT

A semiconductor laser apparatus and housing are designed so that laser light leaving the housing through a window glass in the housing satisfies the following equation (3):

$$0.4 \times \frac{\lambda_0^2}{\Delta\lambda} \leq d \leq 0.6 \times \frac{\lambda_0^2}{\Delta\lambda} \quad (3)$$

wherein d is the distance between the window glass and the laser light-emitting facet of the semiconductor laser device, $\lambda_0$ is the oscillation wavelength of laser light, and $\Delta\lambda$ is the space between the adjacent longitudinal modes.

2 Claims, 2 Drawing Sheets

SEMICONDUCTOR LASER APPARATUS

BACKGROUND OF THE INVENTION

1. Field of the Invention

This invention relates to a semiconductor laser apparatus with an improved performance that is used for optical measurements.

2. Description of the Prior Art

When a semiconductor laser is used for optical measurements, a non-linear relationship between the injection-driving current and the optical output power of the semiconductor laser and/or a variation in the oscillation wavelength of the semiconductor laser drastically lower the precision of the said measurements. For instance, when an optical measurement is carried out utilizing the interference between the laser light from a semiconductor laser and the reflected light from an object to be measured, the interference pattern varies with a variation in the oscillation wavelength, which makes such a measurement difficult.

FIG. 5 shows the structure of a conventional semiconductor laser apparatus, which comprises a housing 10, a semiconductor laser device 100 disposed within the housing 10, and a wiring 6 connecting the semiconductor laser device 100 to the external power source. The housing 10 is constituted by a base 2, a heat sink 3, side walls 4 and a glass window 5. The semiconductor laser device 100 is mounted on the heat sink 3, which is supported by the base 2. The semiconductor laser device 100 is connected to a lead pin 7 by the wiring 6 made of Au or Al. The lead pin 7 extends to the outside of the housing 10 through the base 2. When driving current is injected into the semiconductor laser device 100 through the lead pin 7 and the wiring 6, laser light is emitted from the semiconductor laser device 100 and radiated outside of the housing 10 through the glass window 5. The glass 50 constituting the glass window 5 is disposed in the direction that is vertical to the proceeding direction of the laser light so as to prevent aberration by the glass 50, so that a part of the laser light with which the window glass 50 is irradiated is reflected by the window glass 50 and returns to the semiconductor laser device 100. Accordingly, due to the etalon characteristics of the semiconductor laser device 100 that depend upon the distance between the semiconductor laser device 100 and the window glass 50, the phenomenon arises that the facet of the semiconductor laser device 100 exhibits a higher effective reflectivity for laser light with a certain wavelength and a lower effective reflectivity for laser light with another wavelength. The said characteristics periodically arise. The space $\Delta\lambda e$ between the said wavelengths periodically emerges and is represented by the equation (1):

$$\Delta\lambda e = \lambda_0^2 / 2d \qquad (1)$$

wherein $\lambda_0$ is the oscillation wavelength of laser light and d is the distance between the semiconductor laser device 100 and the window glass 50.

On the other hand, the space $\Delta\lambda$ between the adjacent longitudinal modes of the semiconductor laser device 100 is represented by the equation (2), as is well known:

$$\Delta\lambda = +_0^2 / 2nl \qquad (2)$$

wherein n is the effective refractive index of a resonator of the semiconductor laser device and l is the internal-cavity length.

FIG. 3 shows the relationship between the reflection gain represented by the equation (1) and the longitudinal mode of laser light in the case that $\Delta\lambda e = 1.5\Delta\lambda$. Provided that, as shown in line (b) of FIG. 3, a longitudinal mode D of laser light agrees with a high portion of the reflection gain indicated by reference mark (a) that is positioned near the peak of gain of the semiconductor laser device 100, when the longitudinal mode moves relatively toward the longer wavelength region due to changes in currents and/or temperatures, then the longitudinal mode E that is adjacent to the longitudinal mode D agrees with the high portion of the reflection gain as shown in line (c) of FIG. 3. Moreover, the longitudinal mode C, likewise, agrees with the high portion of the reflection gain as shown in line (d) of FIG. 3. In this way, the oscillation mode gives rise to mode hopping (i.e., changes in the longitudinal oscillation mode) such as that from mode D to mode C through mode E (i.e., D→E→C). Even when the longitudinal mode D is maintained without mode hopping, optical output power of the semiconductor laser device 100 is not linearly proportional to currents and/or the ratio of the oscillation mode to the non-oscillation mode is markedly reduced.

The above-mentioned problems also arise in lasers such as internal reflector interferometric lasers, composite cavity laser devices, external resonator type lasers, etc., that have been proposed so as to stabilize the longitudinal oscillation modes. Distributed feedback (DFB) lasers also give rise to the problems that mode hopping between the two DFB modes sandwiching a stop band therebetween arises and that the ratio of the oscillation mode to the non-oscillation mode with a space that can be represented by the equation (2) varies. In order to eliminate the above-mentioned problems, a process by which the window glass is coated with a film for the prevention of a laser light reflection has been developed. However, such a film must be made with multi-layered dielectric films, etc., so as to create a low reflectivity, which necessitates highly accurate and complicated production processes.

SUMMARY OF THE INVENTION

The semiconductor laser apparatus of this invention, which overcomes the above-discussed and numerous other disadvantages and deficiencies of the prior art, comprises a semiconductor laser device and a housing containing said semiconductor laser device therein, laser light from said semiconductor laser device passing through a window glass that constitutes a part of said housing and going to the outside of said housing, wherein the distance between the window glass and the laser light-emitting facet of said semiconductor laser device meet the following equation (3):

$$0.4 \times \frac{\lambda_0^2}{\Delta\lambda} \leq d \leq 0.6 \times \frac{\lambda_0^2}{\Delta\lambda} \qquad (3)$$

wherein d is the above-mentioned distance, $\lambda_0$ is the oscillation wavelength of laser light, and $\Delta\lambda$ is the space between the adjacent longitudinal modes.

In a preferred embodiment, the semiconductor laser device is an external resonator type semiconductor laser device, an internal reflector interferometric semiconductor laser device, a composite cavity semiconductor laser device, a distributed feedback semiconductor laser device or a distributed Bragg reflector type semiconductor laser device.

Thus, the invention described herein makes possible the objects of (1) providing a semiconductor laser apparatus in which longitudinal modes are not affected by the reflection of laser light from the window glass of the housing, so that stabilized longitudinal oscillation modes and optical output power characteristics can be obtained; and (2) providing a semiconductor laser apparatus in which the distance between the semiconductor laser device and the window glass is set to meet specific requirements, thereby preventing the occurrence of mode hopping and/or minimizing the instability of optical output power by the reflection of laser light from the window glass.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a semiconductor laser apparatus in which the space between the reflection gains that are created by the window glass and the facet of a semiconductor laser device agrees with the space between the adjacent longitudinal modes, so that even though the positional relationship between the reflection gain and the longitudinal mode relatively change, the reflection gain can have the same influence on the longitudinal mode. That is, the semiconductor laser apparatus is constructed such that the distance between the window glass and the facet of a semiconductor laser device to be incorporated into the said apparatus meets the equation (3):

$$0.4 \times \frac{\lambda_0^2}{\Delta\lambda} \leq d \leq 0.6 \times \frac{\lambda_0^2}{\Delta\lambda} \quad (3)$$

wherein $\Delta\lambda$ is the space between adjacent longitudinal modes, $\lambda_0$ is the oscillation wavelength of laser light and d is the distance between the window glass and the facet of the semiconductor laser device.

Figure 3:
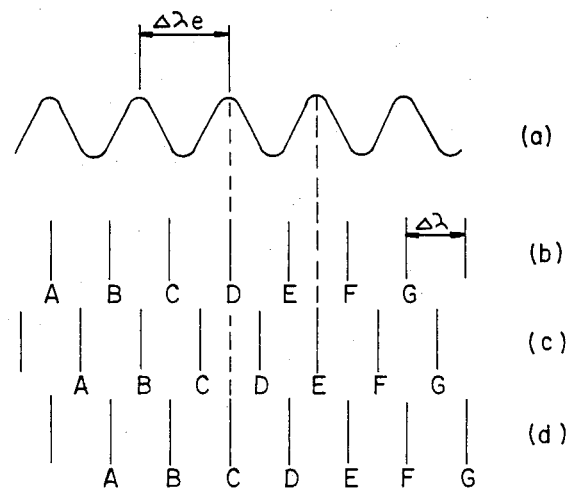
FIG. 3 is a diagram showing the relationship between the reflection of laser light from the window glass of the housing and the longitudinal oscillation modes with regard to a conventional semiconductor laser apparatus.
Figure 4:
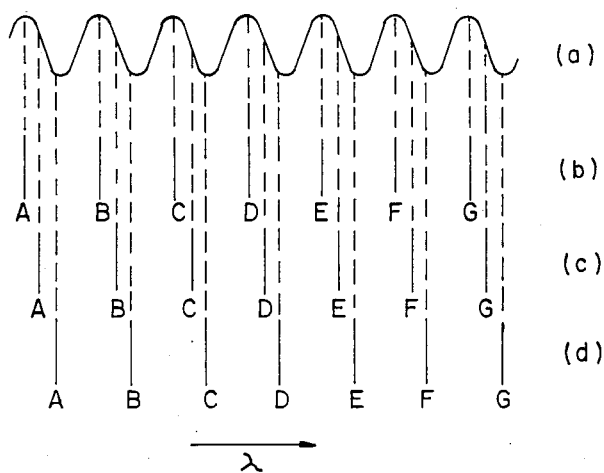
FIG. 4 is a diagram showing the relationship between the reflection of laser light from the window glass of the housing and the longitudinal oscillation modes with regard to the semiconductor laser apparatus of this invention shown in FIG. 1.

The above-mentioned feature of this invention can be explained by FIG. 4, which shows the case that the space $\Delta\lambda e$ between the adjacent wavelengths is equal to the space $\Delta\lambda$ between the adjacent longitudinal modes. Provided that the laser is oscillated in a longitudinal mode D as shown in line (b) of FIG. 4 in the same way as that in line (b) of FIG. 3, even when the longitudinal mode shift from that of line (b) of FIG. 4 to that of line (c) of FIG. 4, and from that of line (c) of FIG. 4 to that of line (d) of FIG. 4 to that of FIG. 4(d), each longitudinal mode is influenced by the reflection gain in the same manner. Accordingly, neither mode hopping nor changes in the ratio of oscillation mode to the non-oscillation mode arise, which allows the maintenance of stabilized oscillation in the longitudinal mode D.

EXAMPLE

Figure 1:
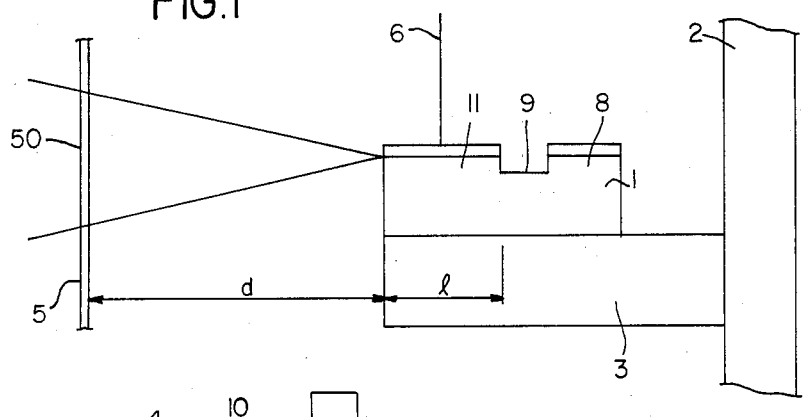
FIG. 1 is a schematic diagram showing a semiconductor laser apparatus of this invention.
Figure 5:
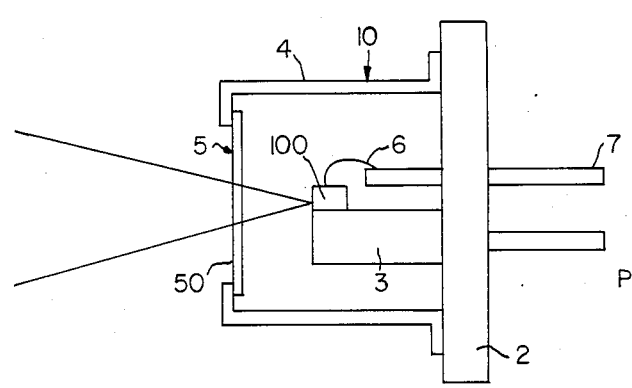
FIG. 5 is a schematic diagram showing a conventional semiconductor laser apparatus.

FIG. 1 shows a semiconductor laser apparatus of this invention, which comprises a housing (not shown), an external resonator type semiconductor laser device 1 disposed within the housing, a heat sink 3 on which the semiconductor laser device 1 is mounted, a base 2 that constitutes a part of the housing and that supports the heat sink 3, and a glass window 5 that constitutes a part of the housing. The distance d between the window glass 50 and the semiconductor laser device 1 is set to be 1.00 mm so as to satisfy the conditions indicated by the equation (3). The semiconductor laser device 1 has an internal cavity length of 250 μm and oscillates laser with an oscillation wavelength of about 7800 Å. The space between the adjacent longitudinal modes is 2.9 Å. The semiconductor laser device 1 has a groove 9 in the direction parallel to the facets thereof by which a laser-oscillating area 11 and a light-detecting area 8 are monolithically formed. The groove 9 is formed by an etching technique.

Figure 2A:
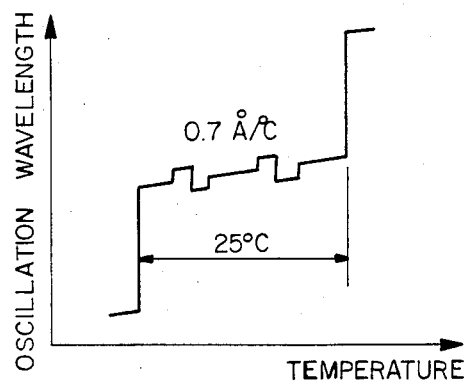
FIG. 2(a) is a characteristic curve showing the relationship between the changes in temperature and the oscillation wavelength of laser light of a conventional semiconductor laser apparatus.

FIG. 2(a) shows the relationship between the oscillation wavelength and the temperature in the case that a conventional semiconductor laser apparatus with a distance of 0.7 mm between the semiconductor laser device and the window glass oscillates a laser with optical output power maintained at a fixed level, indicating that mode hopping periodically arises between the adjacent longitudinal modes due to the reflection of laser light from the window glass although changes in the oscillation wavelength are minimized more than those of the oscillation wavelength of an ordinary Fabry-Pérot semiconductor laser.

Figure 2B:
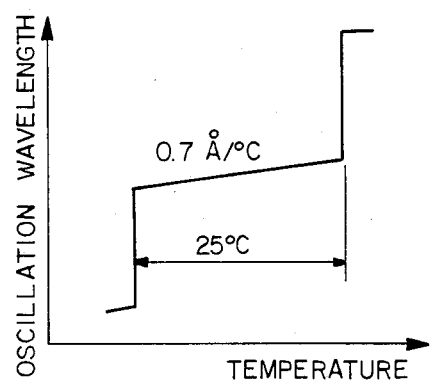
FIG. 2(b) is a characteristic curve showing the relationship between the changes in temperature and the oscillation wavelength of laser light of the semiconductor laser apparatus of this invention shown in FIG. 1.

FIG. 2(b) shows the relationship between the oscilation wavelength and the temperature with regard to the semiconductor laser apparatus of this invention shown in FIG. 1 in the case that the distance d between the semiconductor laser device and the window glass is 1 mm, indicating that mode hopping never arises over a wide temperature range (i.e., over a 25° C. span) and oscillation is attained in a stabilized longitudinal mode.

Although it is desirable that the above-mentioned distance d is equal to $\lambda_0^2/2\Delta\lambda$, the experimental data obtained by the inventors of this invention indicated that when the distance d satisfies the equation (3), the desirable results such as those shown in FIG. 2(b) are obtainable.

The above-mentioned example only discloses an external resonator type semiconductor laser device but this invention is, of course, applicable to any semiconductor laser device so long as the distance d between the facet of the semiconductor laser device and the window glass meets the equation (3).

As mentioned above, when the distance d satisfies the equation (3), mode hopping does not arise, so that laser oscillation can be attained in a stabilized longitudinal mode. In addition, laser oscillation in a stabilized longitudinal mode can be attained by the use of an external resonator type semiconductor laser device such as that described in the above-mentioned example. This effect can be also attained by the use of an internal reflector interferometric semiconductor laser device, a composite cavity semiconductor laser device or a distributed feedback semiconductor laser device or a distributed Bragg reflector type semiconductor laser device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser apparatus comprising a semiconductor laser device and a housing containing said semiconductor laser device therein, laser light from said semiconductor laser device passing through a window glass that constitutes a part of said housing and going to the outside of said housing, wherein the distance between the window glass and the laser light-emitting facet of said semiconductor laser device meet the following equation (3), thereby preventing the occurrence of mode hopping and minimizing the instability of optical output power by the reflection of laser light from the window glass:

$$0.4 \times \frac{\lambda_0^2}{\Delta \lambda} \leq d \leq 0.6 \times \frac{\lambda_0^2}{\Delta \lambda} \qquad (3)$$

wherein d is the above-mentioned distance, $\lambda_0$ is the oscillation wavelength of laser light, and $\Delta \lambda$ is the space between the adjacent longitudinal modes.

2. A semiconductor laser apparatus according to claim 1, wherein said semiconductor laser device is an external resonator type semiconductor laser device, an internal reflector interferometric semiconductor laser device, a composite cavity semiconductor laser device, a distributed feedback semiconductor laser device or a distributed Bragg reflector type semiconductor laser device.

* * * * *